(12) United States Patent
Hsu et al.

(10) Patent No.: US 6,711,049 B1
(45) Date of Patent: Mar. 23, 2004

(54) ONE TRANSISTOR CELL FERAM MEMORY ARRAY

(75) Inventors: Sheng Teng Hsu, Camas, WA (US); Jong-Jan Lee, Camas, WA (US); Fengyan Zhang, Vancouver, WA (US); Nobuyoshi Awaya, Nara (JP)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/282,985

(22) Filed: Oct. 28, 2002

(51) Int. Cl.[7] ............................................... G11C 11/22
(52) U.S. Cl. ........................................ 365/145; 365/129
(58) Field of Search .................................. 365/129, 145

(56) References Cited

U.S. PATENT DOCUMENTS 6,370,056 B1 * 4/2002 Chen et al. .................. 365/145
6,510,073 B1 * 1/2003 Lee et al. .................... 365/145

* cited by examiner

Primary Examiner—M. Tran
(74) Attorney, Agent, or Firm—David C. Ripma; Matthew D. Rabdau; Scott C. Krieger

(57) ABSTRACT

A one-transistor FeRAM memory cell array includes an array of ferroelectric transistors arranged in rows and columns, each transistor having a source, a drain, a channel, a gate oxide layer over the channel and a ferroelectric stack formed on the gate oxide layer; word lines connecting the gate ferroelectric stack top electrodes of transistors in a row of the array; a connection to the channel of all transistors in the array formed by a substrate well; a set of first bit lines connecting the sources of all transistors in a column of the array; and a set of second bit lines connecting the drains of all transistors in a column of the array; wherein the ferroelectric stack has opposed edges, which, when projected to a level of the source, drain and channel, are coincident with an abutted edge of the source and the channel and the drain and the channel, respectively.

16 Claims, 2 Drawing Sheets

ONE TRANSISTOR CELL FERAM MEMORY ARRAY

FIELD OF THE INVENTION

This invention relates to non-volatile memory, and specifically to a single transistor ferroelectric random access memory (FeRAM) memory array.

BACKGROUND OF THE INVENTION

Flash memory and EEPROM are the state-of-the-art single transistor non-volatile memory cells. The programming of these devices requires high voltage and a high-power electrical pulse, which causes electrons to tunnel through a thin gate oxide present in these devices, or which create "hot" electrons, which may hop over an oxide energy barrier to a floating gate.

SUMMARY OF THE INVENTION

A one-transistor FeRAM memory cell array includes an array of ferroelectric transistors arranged in rows and columns, each transistor having a source, a drain, a channel, a gate oxide layer over the channel and a ferroelectric stack formed on the gate oxide layer; word lines connecting the gate ferroelectric stack top electrodes of transistors in a row of the array; a connection to the channel of all transistors in the array formed by a substrate well; a set of first bit lines connecting the sources of all transistors in a column of the array; and a set of second bit lines connecting the drains of all transistors in a column of the array; wherein the ferroelectric stack has opposed edges, which, when projected to a level of the source, drain and channel, are coincident with an abutted edge of the source and the channel and the drain and the channel, respectively.

An object of the invention is to provide an array of ferroelectric non-volatile single transistor memory cells in a for random access memory application.

Another object of the invention is to provide a FeRAM which uses a programming voltage approximately less than two times that of the operating voltage.

A further object of the invention is to provide a FeRAM array which is compatible with state of the art ULSI technology and which is scalable to very low voltage operation.

Another object of the invention is to provide a modified array having a low power dissipation during a write operation.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

This invention provides a ferroelectric random access memory (FeRAM) array having a very simple low voltage programming process. Because the ferroelectric memory cell of the invention is symmetric, the source and the drain of the memory cell may be interchangeably connected to a memory controller.

The FeRAM of the invention includes a ferroelectric non-volatile transistor which may be configured into an array of single transistor memory cells in RAM applications. The programming voltage of the FeRAM array of the invention is approximately less than two times that of the operation voltage, as determined by experimentation, and is in the range of between about 2 volts to 5 volts. Flash memory, on the other hand, requires a high voltage. The memory transistor has a symmetric source/drain structure. An off-set junction or large gate-to-source or gate-to-drain junction overlap is not required, as is the case in a conventional flash memory. Thus, the FE stack has opposed edges which, when projected to the level of the source/drain are coincident with the edges of the source and drain as those structures abut the channel. Therefore, The FeRAM array of the invention is compatible to the state of the art ULSI technology and is scalable to very low voltage operation.

Figure 1:
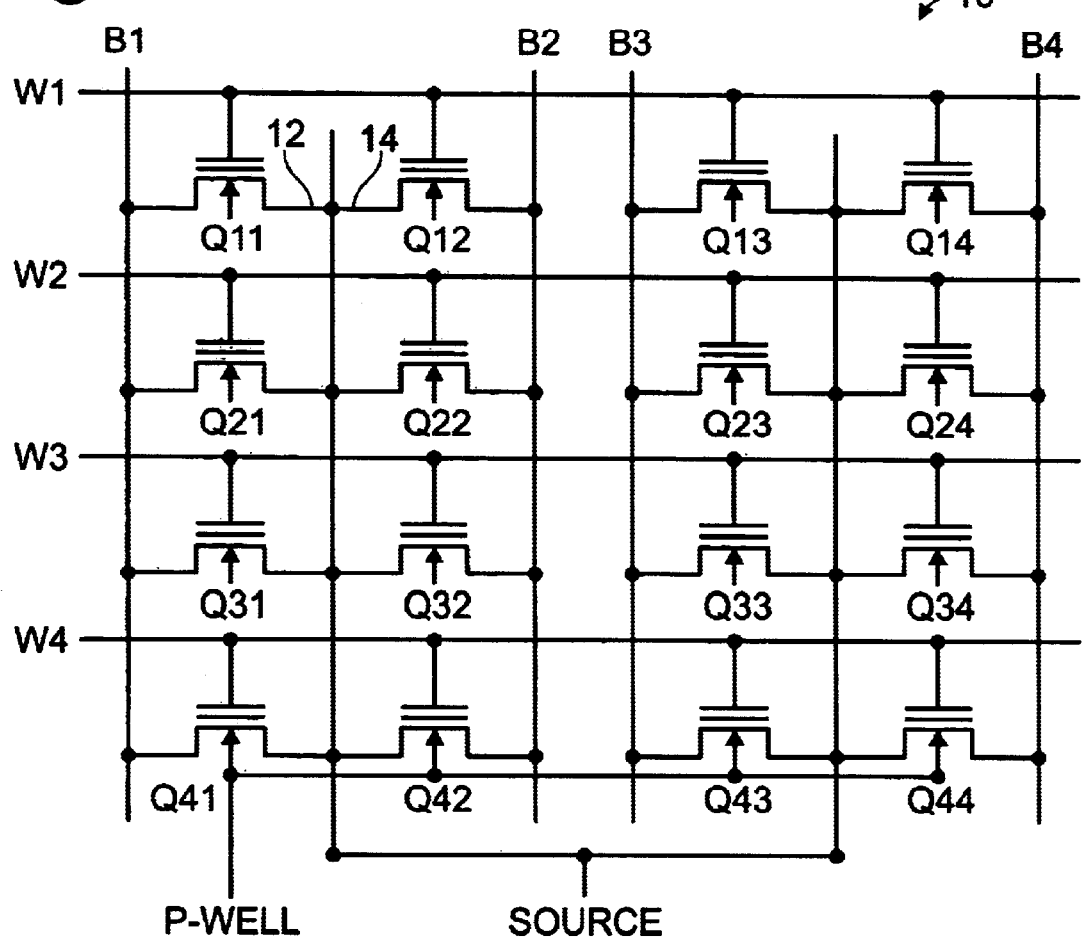
FIG. 1 depicts a first embodiment of a 4×4 FeRAM memory array constructed according to the invention.

A 4×4-memory array constructed according to a first embodiment of the invention is depicted in FIG. 1, generally at 10. Although array 10 is depicted as a sixteen unit array, wherein each unit includes a transistor and a capacitor, and where the units are designated Q11 through Q44, larger arrays may be easily fabricated. As previously noted, in this embodiment the source and drain of each transistor are interchangeable, however, for purposes of illustration, the source of transistor Q11 is designated by reference number 12, and the source of transistor Q12 is designated by reference number 14. The drain of each memory transistor is the bit output and is isolated. The channels of all transistors are formed in a common p-well, 16. Array 10 is fabricated by sate-of-the-art processes for FE devices.

Figure 2:
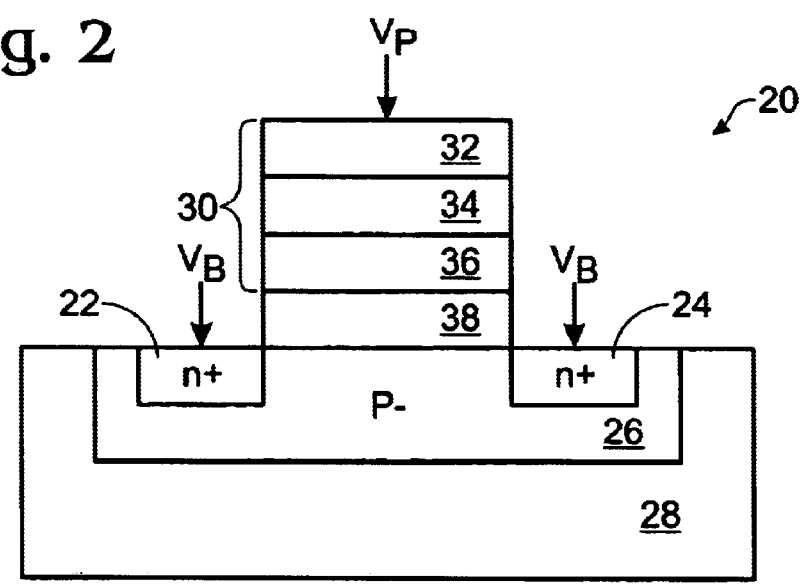
FIG. 2 is a generalized cross-section through a FE memory cell of the invention.
Figure 3:
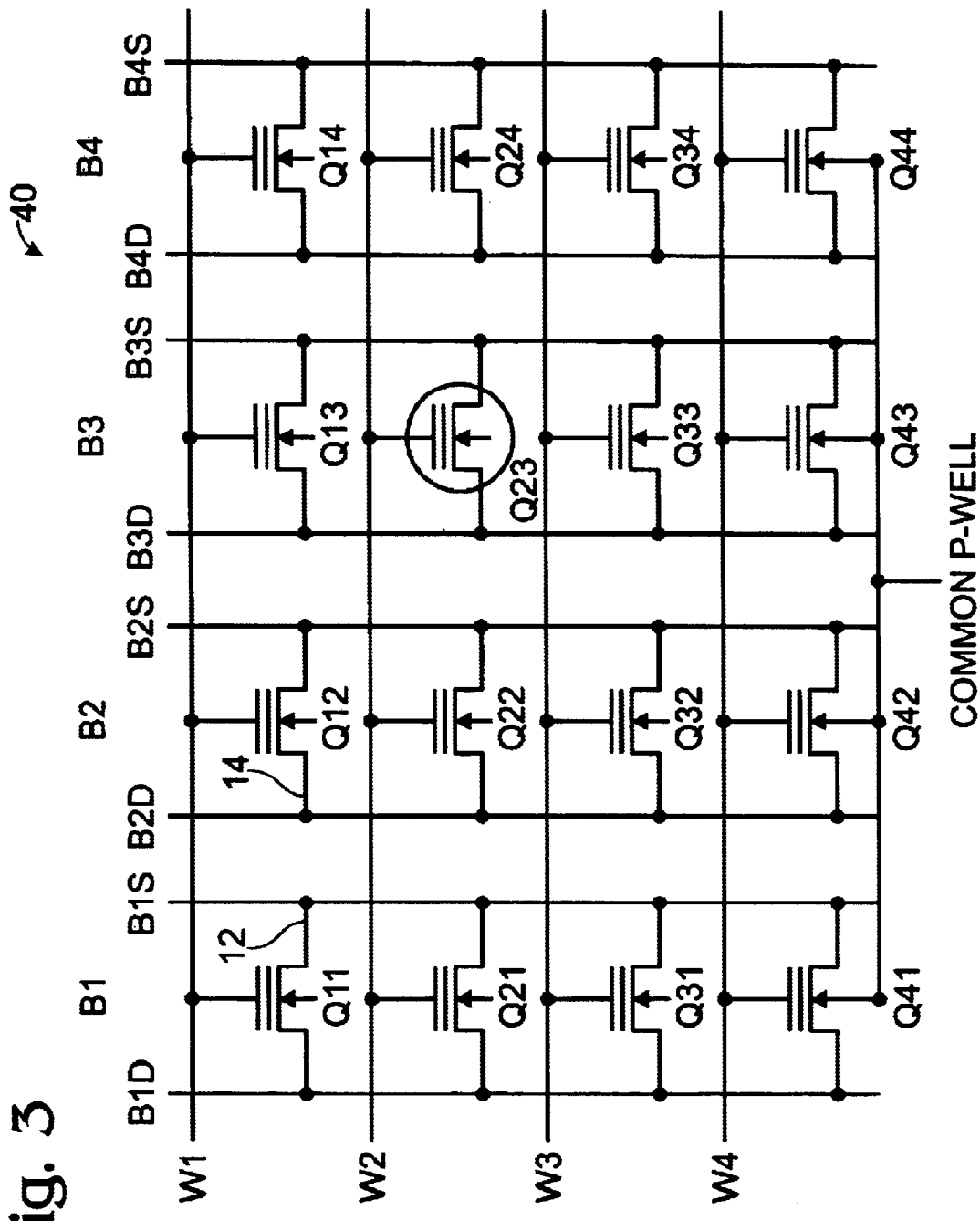
FIG. 3 depicts a second embodiment of a 4×4 FeRAM memory array constructed according to the invention.

A generalized memory cell, or transistor, 20 is depicted in FIG. 2. Cell 20 has a source 22, a drain 24, a channel 26, a substrate 28 and a FE stack 30 located on a gate oxide layer 38. FE stack 30 includes a top electrode 32, a FE layer and a bottom electrode 36. In the embodiment described herein, source 22 and drain 24 are N+ silicon, channel 26 is P-type silicon, forming a P-well, and substrate 28 is N-silicon.

Block Erases to High Threshold Voltage

Array 10 may be block erased by applying a negative programming voltage, $-V_P$, to "Word" lines W1–W4, while maintaining "Bit" lines B1–B4, (connected to the drains of Q11–Q44) the source and the P-well at the ground potential. Because the word line potential is negative with respect of source, drain, and substrate, which are at the ground potential, the channel is at the accumulation condition. Holes are accumulated at the surface of the channel region of each transistor. The potential difference between the gate and the channel of a ferroelectric transistor connected to a given word line is at a potential $V_P$, $V_P$, the programming voltage, is approximately equal to the $\Delta V$ between the gate and the channel. The ferroelectric capacitors of these transistors pull a positive charge to the top electrode, thus all transistors in a given "word" are programmed to a high threshold voltage. Alternatively, the word line may be grounded, and a positive pulse, with amplitude $+V_P$ applied to the P-well to erase the memory of the block.

Selective Programming to Low Threshold Voltage

During selective bit programming all bit lines and source lines are biased at $V_B$, the operation voltage, all word lines and P-well 16 are grounded, where $\frac{1}{3}V_P \leq V_B \leq V_P$, or, $V_P \approx 1.5V_B$ to $2.0V_B$. To selectively program a given bit, such as W2B3, circled in FIG. 1, which programs Q23, the memory transistor at the intersection of W2 and B3, to a low threshold voltage, the programming voltage $V_P$ is applied to W2, and B3 is pulsed to 0V (ground), resulting in transistor Q23 being turned "on." The conducting channel of Q23 is at the ground potential. The voltage drop across the control gate and the channel of Q23 is VP which pulls the electrode in the ferroelectric capacitor to the same potential as the top electrode, programming transistor Q23 to a low threshold voltage stage. The gate voltage of all other transistors in W2 is at $V_P$ and the substrate is at ground potential, the source and drain voltages are $V_B$, and the channels of these transistors are depleted. The voltage difference between gate and channel of these transistors is much lower than $V_P$ therefore, the threshold voltage of these transistors is not altered by this selective programming operation.

For the other memory transistors in B3, the bit lines and control gates are at the ground potential, and these transistors are at the "off" stage. The channel is depleted. Therefore, the threshold voltages of these memory transistors are not affected by this operation. All of the other memory transistors are in their "off" states. The gates and the wells are at the ground potential, and the source and drain potential is $V_B$. The channel is depleted. Therefore, the programming of Q23 memory transistor does not disturb the content of the other memory transistors.

Referring now to FIG. 2, a modified memory array of the invention is depicted, generally at 40. The array is similar to that of array 10, except that the source of each bit cell line is isolated from the adjacent bit cells. The source and drain still interchangeable in this embodiment. As is shown in FIG. 2, B1D and B1S are the drain and source lines, respectively, for the first bit. In a Flash EEPROM, the gate must overlap the source and drain. Such structure is not required in this memory device, which allows the source and drain to be interchangeable.

Block Erases to High Threshold Voltage

The block erase of array 40 is identical to that of array 10. Array 40 may be block erased by applying a negative programming voltage to the "Word" line while maintaining the "Bit" lines, the source, and the P-well at the ground potential. Because the word line potential is negative with respect of source, drain, and substrate, which are at the ground potential, the channel is at the accumulation condition. Holes are accumulated at the surface of the channel region of each transistor. The potential difference between the gate and the channel of each ferroelectric transistor connected to a given word line is at the same potential, $V_P$ The ferroelectric capacitors of these transistors pulls a positive charge to the top electrode, resulting in all transistors in a "Word" being set to a high threshold voltage. Alternatively, the word line may be grounded and a positive pulse, with amplitude $+V_P$ applied to the P-well to erase the memory of the block.

Selective Programming to Low Threshold Voltage

During selective bit programming, all bit lines and all source lines are biased at $V_B$, All word lines and the P-well are grounded, where $\frac{1}{3}V_P \leq V_B \leq V_P$ To selectively program a given bit, such as W2B3, which requires programming of Q23, the memory transistor at the intersection of W2 and B3, to a low threshold voltage, the programming voltage $V_P$ is applied to W2. B3D and B3S, the drain and the source lines of bit three are pulsed to 0V. Memory transistor Q23 is turned on. The conducting channel of Q23 is at the ground potential. The voltage drop across the control gate and the channel of Q23 is $V_P$ which pulls the electrode in the ferroelectric capacitor to the same potential as that of the top electrode. The transistor Q23 is therefore, programmed to the low threshold voltage stage. Additionally, the source and the drain of Q23 are at the same potential and the power dissipation is minimal. The gate voltage of all other transistors in W2 is at $V_P$, the substrate is at ground potential and the source and drain voltage is $V_B$. The channels of these transistors are depleted. The voltage difference between gate and channel of these transistors is much lower than $V_P$ therefore, the threshold voltage of these transistors is not altered by this selective programming operation. For memory transistors in B3, the bit lines and control gates are at the ground potential, and these transistors are in the "off" stage. The channel is depleted. Therefore, the threshold voltages of these memory transistors are not affected by this operation. All of the other memory transistors are in the "off" states. The gates and the well are at the ground potential, and the source and drain potential is $V_B$. The channel is depleted. Therefore, the programming of Q23 memory transistor does not disturb the content of the other memory transistors.

Thus, a one transistor cell FeRAM memory array has been disclosed. It will be appreciated that further variations and modifications thereof may be made within the scope of the invention as defined in the appended claims.

We claim:
1. A one-transistor FeRAM memory cell array comprising:
   an array of ferroelectric transistors arranged in rows and columns, each transistor having a source, a drain, a channel, a gate oxide layer over the channel and a ferroelectric stack formed on the gate oxide layer;
   word lines connecting the gate ferroelectric stack top electrodes of transistors in a row of the array;
   a connection to the channel of all transistors in the array formed by a substrate well;
   a set of first bit lines connecting the sources of all transistors in a column of the array; and
   a set of second bit lines connecting the drains of all transistors in a column of the array;
   wherein the ferroelectric stack has opposed edges, which, when projected to a level of the source, drain and channel, are coincident with an abutted edge of the source and the channel and the drain and the channel, respectively.

2. The array of claim 1 wherein the source and drain of a transistor in a column may be connected interchangably.

3. The array of claim 1 wherein a cell in the array is selectively programmed by biasing all bit lines in said first set of bit lines at the operation voltage, and all word lines and the channel are grounded, and wherein a given cell is programmed by setting the word line for that cell to the programming voltage and the bit line for the cell is pulsed to zero volts, resulting in the cell being turned on.

4. The array of claim 1 wherein the array is block erased by applying a negative programming voltage all of the word lines while maintaining both sets of bit lines and channel at ground potential.

5. The array of claim 1 wherein the array is block erased by applying a ground potential to all word lines and applying a positive pulse, with amplitude $+V_p$, to the channel.

6. The array of claim 1 wherein pairs of adjacent cells in a row have their sources located next to, and connected with, one another.

7. The array of claim 1 wherein cells in a row have their sources connected on a column bit line, which bit line is not connected sources of adjacent cells.

8. The array of claim 7 wherein a cell in the array is selectively programmed by biasing all source bit lines at the operation voltage, and all word lines and the channel are grounded, and wherein a given cell is programmed by setting the word line for that cell to the programming voltage and the bit line for the cell is pulsed to zero volts, resulting in the cell being turned on, wherein said programming voltage is less than two time said operation voltage.

9. The array of claim 7 wherein the array is block erased by applying a negative programming voltage all of the word lines while maintaining both sets of bit lines and channel at ground potential.

10. The array of claim 7 wherein the array is block erased by applying a ground potential to all word lines and applying a positive pulse, with amplitude $+V_P$, to the channel.

11. A one-transistor FeRAM memory cell array comprising:
- an array of ferroelectric transistors arranged in rows and columns, each transistor having a source, a drain, a channel, a gate oxide layer over the channel and a ferroelectric stack formed on the gate oxide layer;
- word lines connecting the gate ferroelectric stack top electrodes of transistors in a row of the array;
- a connection to the channel of all transistors in the array formed by a substrate well;
- a set of first bit lines connecting the sources of all transistors in a column of the array; and
- a set of second bit lines connecting the drains of all transistors in a column of the array;
- wherein the ferroelectric stack has opposed edges, which, when projected to a level of the source, drain and channel, are coincident with an abutted edge of the source and the channel and the drain and the channel, respectively;
- wherein a cell in the array is selectively programmed by biasing all bit lines in said first set of bit lines at an operation voltage, and all word lines and the channel are grounded, and wherein a given cell is programmed by setting the word line for that cell to a programming voltage and the bit line for the cell is pulsed to zero volts, resulting in the cell being turned on, wherein said programming voltage is less than two time said operation voltage.

12. The array of claim 11 wherein the source and drain of a transistor in a column may be connected interchangably.

13. The array of claim 11 wherein the array is block erased by applying a negative programming voltage all of the word lines while maintaining both sets of bit lines and channel at ground potential.

14. The array of claim 11 wherein the array is block erased by applying a ground potential to all word lines and applying a positive pulse, with amplitude $+V_P$, to the channel.

15. The array of claim 11 wherein pairs of adjacent cells in a row have their sources located next to, and connected with, one another.

16. The array of claim 11 wherein cells in a row have their sources connected on a column bit line, which bit is not connected sources of adjacent cells.

* * * * *